US010566380B2

(12) United States Patent
Jung et al.

(10) Patent No.: US 10,566,380 B2
(45) Date of Patent: Feb. 18, 2020

(54) IMAGE SENSOR WITH DUAL TRENCH ISOLATION STRUCTURES AT DIFFERENT ISOLATION STRUCTURE DEPTHS (71) Applicant: OmniVision Technologies, Inc., Santa Clara, CA (US)

(72) Inventors: Young Woo Jung, Campbell, CA (US); Lindsay Grant, Los Gatos, CA (US); Dyson Tai, San Jose, CA (US); Vincent Venezia, Los Gatos, CA (US); Wei Zheng, Los Gatos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 135 days.

(21) Appl. No.: 15/786,874

(22) Filed: Oct. 18, 2017

(65) Prior Publication Data

US 2019/0115388 A1 Apr. 18, 2019

(51) Int. Cl.
*H01L 27/146* (2006.01)
*H01L 27/148* (2006.01)

(52) U.S. Cl.
CPC .... *H01L 27/14812* (2013.01); *H01L 27/1463* (2013.01); *H01L 27/1464* (2013.01); *H01L 27/14612* (2013.01); *H01L 27/14641* (2013.01); *H01L 27/14643* (2013.01); *H01L 27/14687* (2013.01); *H01L 27/14689* (2013.01); *H01L 2221/1057* (2013.01)

(58) Field of Classification Search
CPC ............. H01L 21/762; H01L 21/76229; H01L 27/1463; H01L 2221/1057; H01L 27/14643; H01L 27/14812; H01L 27/14612; H01L 27/1464; H04N 5/37
USPC ....................................................... 250/208.1
See application file for complete search history.

(56) References Cited

U.S. PATENT DOCUMENTS 9,609,250 B2 * 3/2017 Lee ..................... H01L 27/1463
9,621,834 B2 4/2017 Ui
2007/0040922 A1 2/2007 McKee et al.

FOREIGN PATENT DOCUMENTS

JP 2008-186814 8/2007

OTHER PUBLICATIONS

ROC (Taiwan) Patent Application No. 107135458—Office Action with English translation dated Sep. 23, 2019, 14 pages.

* cited by examiner

*Primary Examiner* — Que Tan Le
(74) *Attorney, Agent, or Firm* — Christensen O'Connor; Johnson Kindness PLLC (57) ABSTRACT An image sensor includes a plurality of photodiodes disposed in a semiconductor material to convert image light into image charge. A floating diffusion is disposed proximate to the plurality of photodiodes to receive the image charge from the plurality of photodiodes. A plurality of transfer transistors is coupled to transfer the image charge from the plurality of photodiodes into the floating diffusion in response to a voltage applied to the gate terminal of the plurality of transfer transistors. A first trench isolation structure extends from a frontside of the semiconductor material into the semiconductor material and surrounds the plurality of photodiodes. A second trench isolation structure extends from a backside of the semiconductor material into the semiconductor material. The second trench isolation structure is disposed between individual photodiodes in the plurality of photodiodes.

20 Claims, 6 Drawing Sheets

IMAGE SENSOR WITH DUAL TRENCH ISOLATION STRUCTURES AT DIFFERENT ISOLATION STRUCTURE DEPTHS

TECHNICAL FIELD

This disclosure relates generally to semiconductor fabrication, and in particular but not exclusively, relates to CMOS image sensors.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

Generally, pixels with limited full-well capacity may not capture images well in high light conditions. Pixels that do not have a large enough capacity to store charge may completely saturate with electrons/holes during the exposure period. This is not desirable because saturated pixels may result in washed out or white pixels in the image.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method relating to trench isolation for image sensors are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Figure 1A:
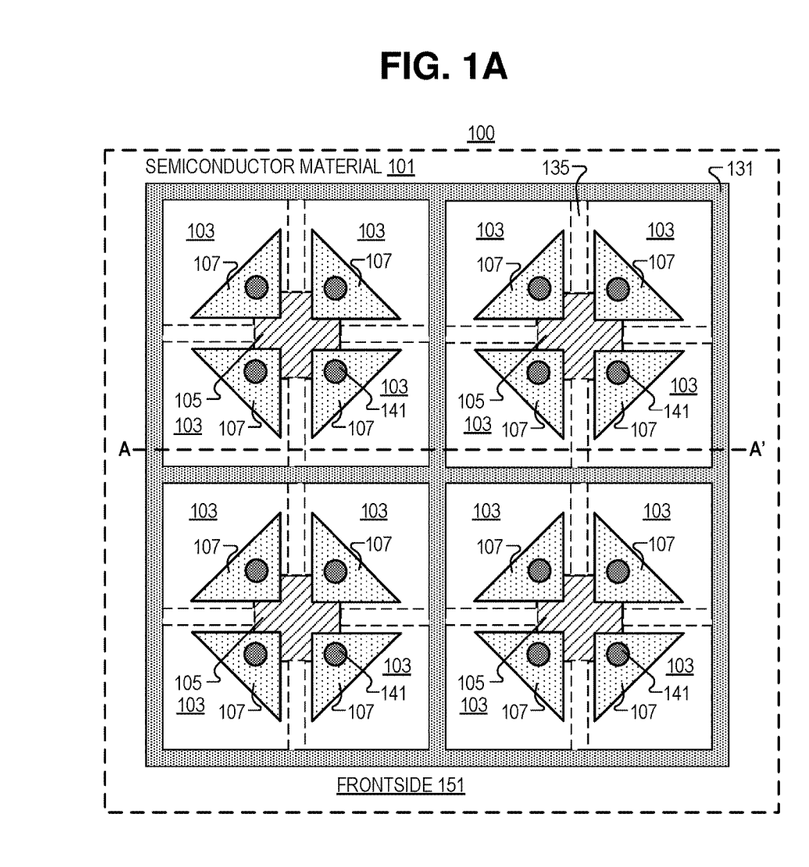
FIGS. 1A-1B illustrate an example image sensor, in accordance with the teachings of the present disclosure.
Figure 1B:
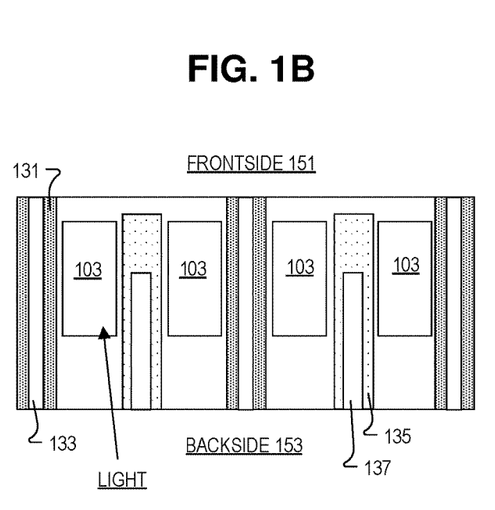

FIGS. 1A-1B illustrate an example image sensor 100, in accordance with the teachings of the present disclosure. Image sensor 100 includes semiconductor material 101, plurality of photodiodes 103, floating diffusion 105, first trench isolation structure 131 (with first core 133), second trench isolation structure 135 (with second core 137), interconnects 141, a frontside 151, and a backside 153.

FIG. 1A depicts a top-down view (from the frontside 151) of image sensor 100. As illustrated, plurality of photodiodes 103 is disposed in semiconductor material 101 to convert image light into image charge. Floating diffusion 105 is disposed proximate to plurality of photodiodes 103 to receive image charge from plurality of photodiodes 103. Plurality of transfer transistors 107 is coupled to transfer the image charge from plurality of photodiodes 103 into floating diffusion 105, in response to a voltage applied to the gate terminals (triangles in the depicted example) of plurality of transfer transistors 107. The voltage may be imparted to the gate terminals by interconnects 141. It is appreciated that plurality of transfer transistors 107 may have a vertical transfer gate like those depicted in FIG. 2C.

As illustrated, first trench isolation structure 131 extends from frontside 151 of semiconductor material 101 into semiconductor material 101, and surrounds the plurality of photodiodes (e.g., groups of four photodiodes 103). Shown as a dotted line—because, in the depicted example, it is located on backside 153—is second trench isolation structures 135 which may extend from backside 153 into semiconductor material 101 (discussed in greater detail in connection with FIG. 1B).

As shown, plurality of photodiodes 103 includes at least four individual photodiodes 103, and at least four individual transfer gates 107. Second trench isolation structure 135 is substantially cross-shaped and extends between individual photodiodes 103 (see e.g., FIG. 1B). In order to avoid saturation of photodiodes 103, in some examples, image sensor 100 is coupled to control circuitry (see e.g., control circuitry 421 of FIG. 4) to control operation of plurality of photodiodes 103, and coupled to readout circuitry (see e.g., readout circuitry 411 of FIG. 4) to readout image charge from plurality of photodiodes 103. In the depicted example, the control circuitry includes logic that when executed by the control circuitry causes the control circuitry to perform a number of operations. For example, the control circuitry may adjust the voltage applied to the gate terminals 107 to allow the image charge accumulated in individual photodiodes 103 to travel between individual photodiodes 103. Alternatively, control circuitry may adjust the voltage applied to gate terminals 107 in order to substantially confine the image charge within individual photodiodes 103. In high light exposure conditions, sharing of image charge may prevent certain photodiodes 103 from saturating and result in an unsaturated, but lower resolution, image. In low light conditions, all photodiodes may capture charge; this results in a higher resolution image. In some examples, the entire array of photodiodes 103 may share charge. Alternatively, only some groupings of photodiodes 103 may share image charge. In this example, the image sensor may determine which photodiodes 103 are close to saturation, and dynamically adjust the voltages on neighboring transfer transistors 107 to share charge among nearby photodiodes 103.

In some examples, a first image may be captured where all the groups of four photodiodes 103 in image sensor 100 are sharing image charge, and then a second image may be captured where all photodiodes 103 capture their own image light. Then the control circuitry, an image sensor processor (ISP), or a controller, may combine the images. In one example, the control circuitry/ISP may actively determine which portions of the high resolution image are over saturated, and substitute these portions for the same unsaturated portions of the lower resolution image. This substitution may occur automatically, or a user may select the substitution from a list of image filtering features. In some examples, a user may choose to capture a low-light condition image, or may choose to capture a high-light condition image with a lower resolution.

FIG. 1B shows a cross sectional illustration of image sensor 100 as cut along line A-A'. As shown, first trench isolation structure 131 surrounds the groups of four photodiodes 103, and second trench isolation structure 135 separates individual photodiodes 103 in the groups of four photodiodes 103. In the depicted example, first core structure 133 (which may include an oxide) is disposed proximate to a center of first trench isolation structure 131, and dopant (e.g., the shaded part of first trench isolation structure 131) in semiconductor material 101 surrounds first core structure 133 at least in part. However, in other examples, first core structure 133 includes a conductive material (e.g., metal or semiconductor), and an oxide material (shaded portion) surrounding the conductive material. In this example, the oxide material is disposed between semiconductor material 101 and first core structure 133. Second core structure 137 may include the same or different architectures than those discussed above and used to form first core structure 133. As shown, second core structure 137 does not extend into semiconductor material 101 as far as first core structure 133. In one example, first core structure 133 is vertically co-extensive with first trench isolation structure 131, while second core structure is not vertically coextensive with second trench isolation structure 135.

Figure 2A:
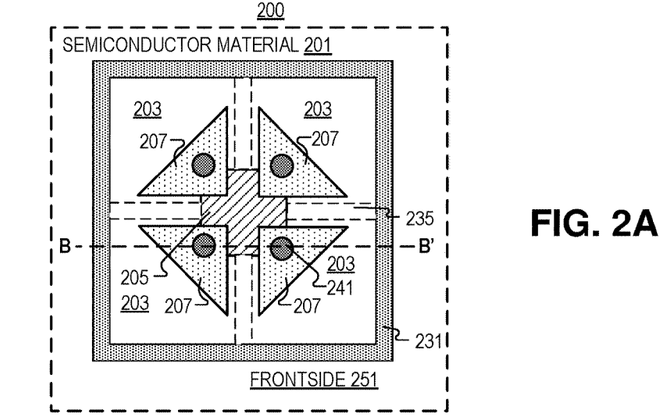
FIGS. 2A-2C illustrate an example image sensor, in accordance with the teachings of the present disclosure.
Figure 2B:
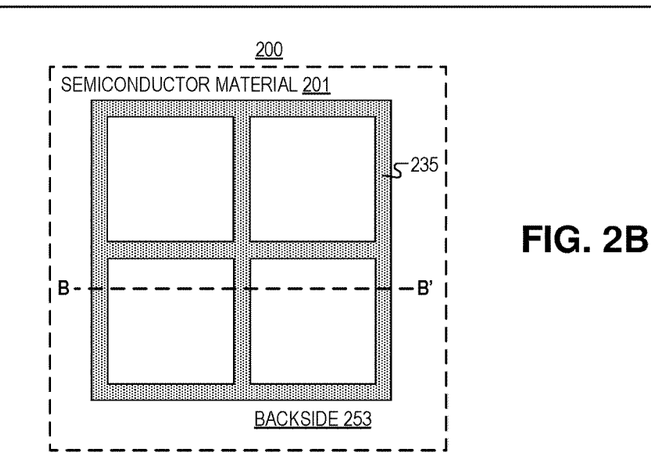
Figure 2C:
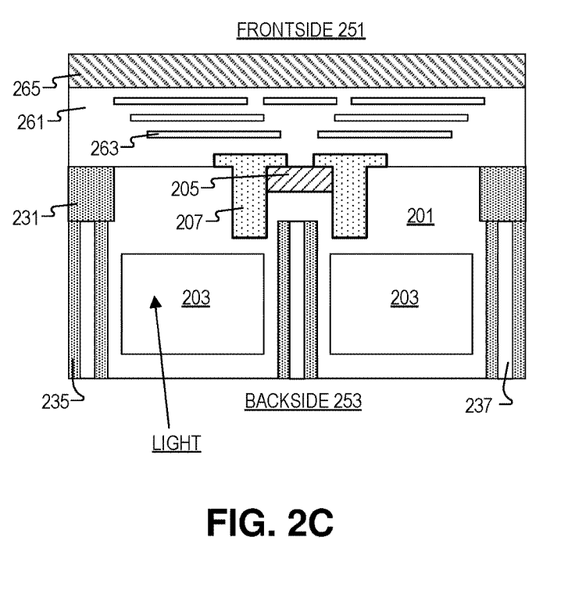

FIGS. 2A-2C illustrate an example image sensor 200, in accordance with the teachings of the present disclosure. It is appreciated that image sensor 200 is similar in many respects to image sensor 100. For example, FIG. 2A depicts a top down view of image sensor 200 (but with dielectric layer 261, interconnects 263, and bonding wafer 265 as shown in FIG. 2C removed from FIG. 2A to avoid obscuring certain features of FIG. 2A) and has many of the same components as image sensor 100 of FIG. 1.

FIG. 2B depicts a bottom-up view of image sensor 200 (a view from backside 253). Unlike FIG. 1A, second trench isolation structure 235, both surrounds the four photodiodes 203, and also separates them by forming a substantially cross-shaped structure. This prevents charge from leaking between photodiodes 203 (when leaking image charge is not desired).

FIG. 2C depicts a cross sectional view of image sensor 200 as cut along line B-B'. In the depicted example, the gate terminals of transfer transistors 207 vertically extend into semiconductor material 201 from frontside 251. As shown, gate terminals 207 surround, at least in part, floating diffusion 205. Transfer transistors 207 (more specifically the gate terminals), extend into the semiconductor material 201 a first depth, and floating diffusion 205 extends into semiconductor material 201 a second depth, and the first depth is greater than the second depth.

As shown, first trench isolation structure 231 also extends a first depth into semiconductor material 201, and second trench isolation structure 235 extends a second depth into semiconductor material 201. As illustrated, the second depth is greater than the first depth, but first trench isolation structure 231 is laterally wider then second trench isolation structure 235. In the depicted example, first trench isolation structure 231 is filled with an oxide. Second trench isolation structure 235 includes an oxide core material 237 and a doped (shaded) portion of semiconductor material 201. In one example, the oxide (e.g., silicon oxide, hafnium oxide, or the like) in first trench isolation structure 231 and second trench isolation structure 235 may be the same, or different. In one example, a nitride (e.g., silicon nitride) or other dielectric material may be used. As shown, dielectric layer 261 (e.g., an oxide or the like) may include, at least in part, control circuitry 263 and readout circuitry 263. Dielectric layer 261 may be disposed between semiconductor material 201 and bonding wafer 265.

FIGS. 3A-3F illustrate a method of image sensor fabrication, in accordance with the teachings of the present disclosure. One of ordinary skill in the art having the benefit of the present disclosure will appreciate that the figures depicted in the method may occur in any order and even in parallel. Additional figures may be added to, or removed from, the method in accordance with the present disclosure.

Figure 3A:
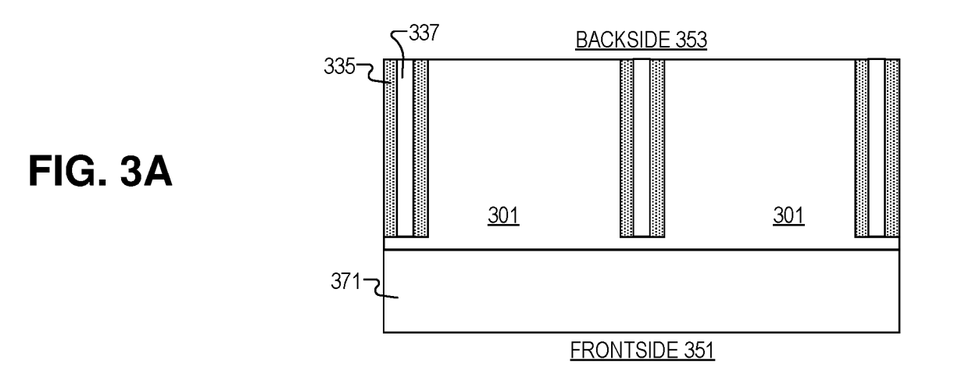
FIGS. 3A-3F illustrate a method of image sensor fabrication, in accordance with the teachings of the present disclosure.

FIG. 3A shows providing semiconductor material 301 and forming second trench isolation structure 335, which extends from backside 353 of semiconductor material 301 into semiconductor material 301. As shown in other examples, second trench 335 includes a substantially cross-shaped portion to separate individual photodiodes 303 in plurality of photodiodes 303. Before second trench isolation structure 335 is formed, epitaxial semiconductor layer 371 (either P-type or N-type) may be grown on semiconductor material 301 though chemical vapor deposition (CVD), or the like.

Second trench isolation structure 335 may be formed by etching a trench in the semiconductor material 301, depositing dopant (shaded portion) in the walls of the trench, and backfilling the trench with an oxide core 335. Alternatively, the trench may be etched, the walls may be lined with an oxide (e.g., silicon oxide, hafnium oxide, or the like), and a conductive core material (e.g., metal or semiconductor) may be deposited in the center of the oxide.

Figure 3B:
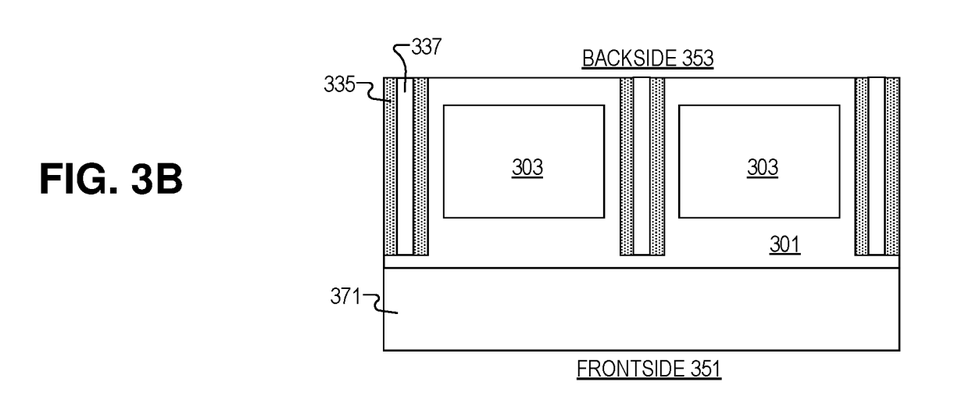

FIG. 3B depicts forming plurality of photodiodes 303 in semiconductor material 301. This may be achieved by implanting phosphorus or arsenic in semiconductor material

301. As shown, second trench isolation structure 335 is disposed, at least in part, between individual photodiodes 303 in plurality of photodiodes 303.

Figure 3C:
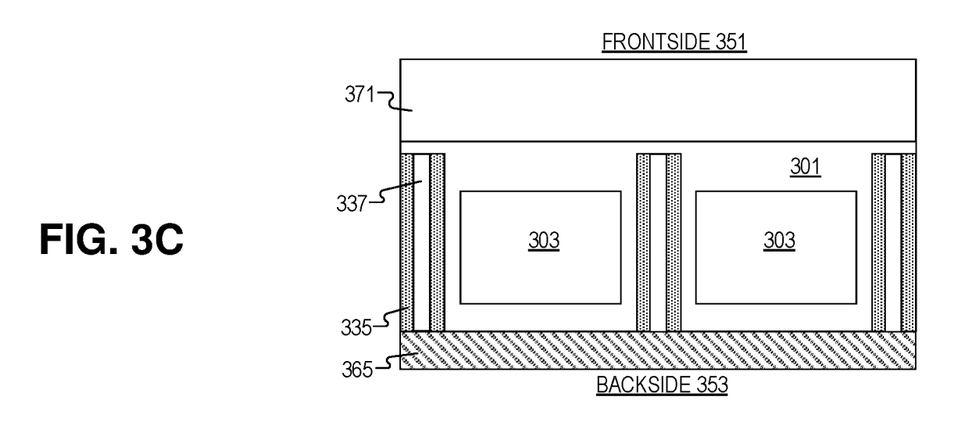

FIG. 3C depicts attaching bonding wafer 365 to backside 353 (e.g., the illuminated side) of semiconductor material 301. This allows the wafer to be flipped and for construction of features in/on frontside 351 of the device.

Figure 3D:
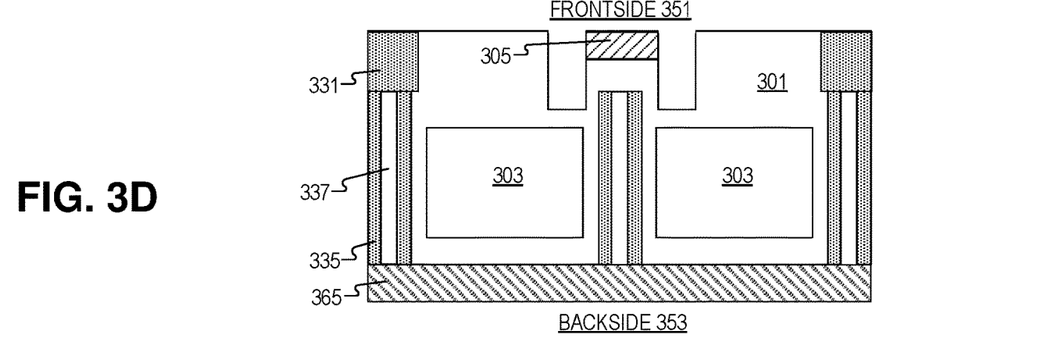

FIG. 3D illustrates forming first trench isolation structure 331 in semiconductor material 301, which extends from frontside 351 of semiconductor material 301 into semiconductor material 301. In some examples, this includes etching a trench in semiconductor material 301, and as shown, this trench may not extend as far into semiconductor material 301 as the trench used to form second trench isolation structure 335. First trench isolation structure 331 surrounds plurality of photodiodes 303 (e.g., four photodiodes 303 depicted). First trench isolation structure 331 may be formed in the same way as second trench isolation structure 335 (described above), or may be etched and filled with oxide, nitride, or the like.

In the depicted example, part of second trench isolation structure 335 also surrounds plurality of photodiodes 303. In this example, the part of second trench isolation structure 335 that surrounds the four photodiodes 303, is optically (e.g., vertical with respect to page orientation) aligned with first trench isolation structure 331. As shown first trench isolation structure 331 and second trench isolation structure 335 may contact each other.

Additionally, FIG. 3D shows part of forming a plurality transfer transistors (etching trenches in semiconductor material 301). After the trenches are etched, a dielectric material (e.g., silicon oxide or hafnium oxide) may be deposited or grown in the trench to form the gate oxide for the transfer transistors.

FIG. 3D also illustrates implanting floating diffusion 305 (with ion implantation of boron, arsenic, phosphorus, or the like) in semiconductor material 301. Floating diffusion 305 is positioned in semiconductor material 301 to receive image charge from plurality of photodiodes 303.

In some examples, semiconductor material 301 may be chemically mechanically polished to remove residual materials left over from forming the circuitry on frontside 351 of the device. Also, P-type epitaxially grown silicon can be deposited on the frontside for better crystalline quality for the transfer transistors.

Figure 3E:
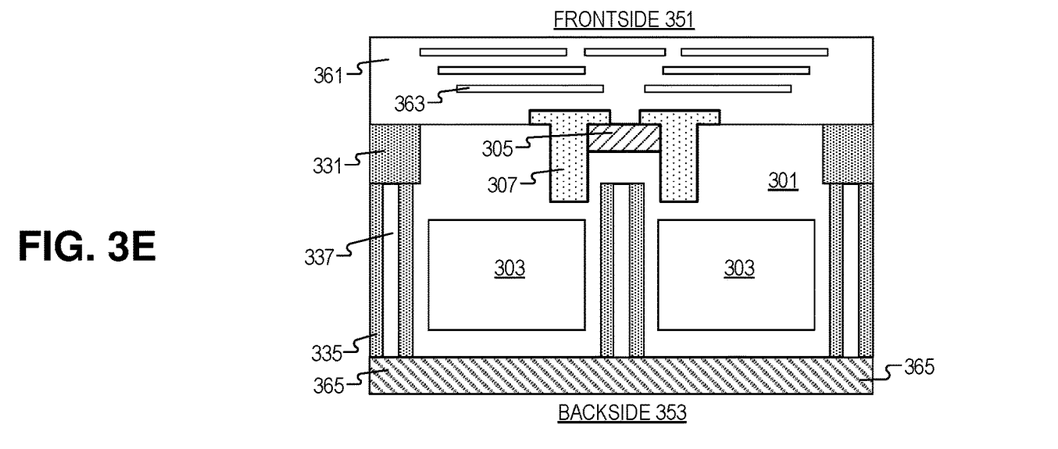

FIG. 3E depicts forming a plurality transfer transistors 307 extending into in the semiconductor material by depositing a conductive material (e.g., doped silicon or metal) in the trench to form a gate terminal. As shown, a cross section of transfer transistors may be substantially "T"-shaped. Thus, a portion of the conductive material is disposed proximate to the frontside of semiconductor material 301, and the frontside surface of semiconductor material 301 is disposed at least in part between the conductive material and semiconductor material 301. After the gate terminal is formed, dielectric layer 361 and interconnects 363 are formed. Deposition of dielectric layer 361 including interconnects 363 may be achieved by physical vapor deposition or the like.

Figure 3F:
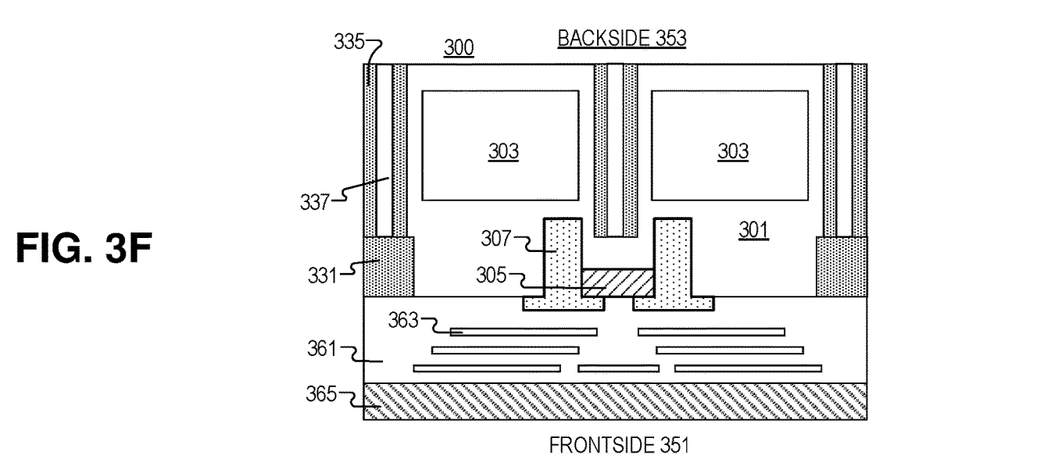

FIG. 3F illustrates removing bonding wafer 365 from backside 353 of semiconductor material 301. A different bonding wafer 365, or a logic wafer, may be attached to frontside 351 (the side with the circuitry) of the device.

In some examples, a metal grid may be formed on backside 353 of semiconductor material 301 to direct image light into the respective photodiodes 303. Similarly, a color filter layer and micro lens layer may be formed so that the color filter layer is disposed between the micro lens layer and semiconductor material 301. The micro lens layer may be formed by depositing blocks of polymer on the surface of the color filters, and reflowing the blocks to form substantially dome-like features.

Figure 4:
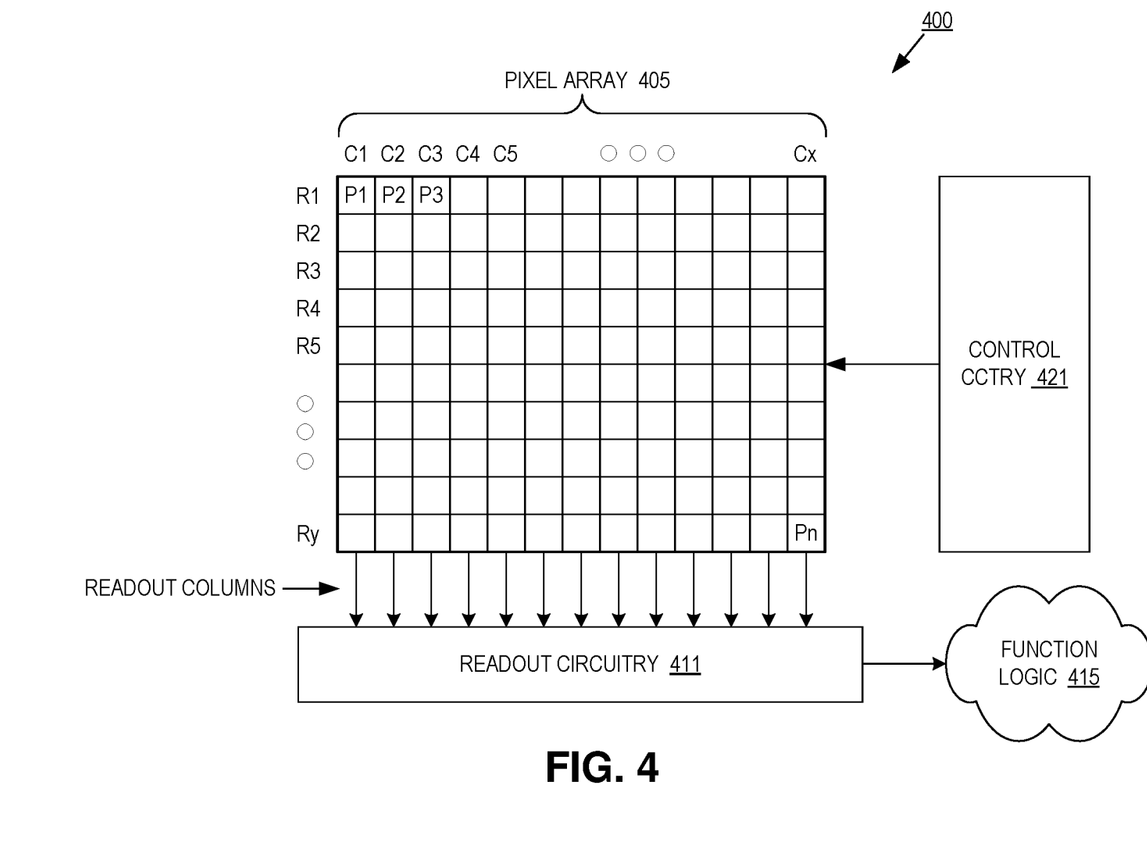
FIG. 4 illustrates a block diagram of one example of an imaging system which may include aspects of FIGS. 1A-2C, in accordance with the teachings of the present disclosure.

FIG. 4 illustrates a block diagram of one example of an imaging system 400 which may include aspects of FIGS. 1A-2C. Imaging system 400 includes pixel array 405, control circuitry 421, readout circuitry 411, and function logic 415. In one example, pixel array 405 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 405 has acquired its image data or image charge, the image data is readout by readout circuitry 411 and then transferred to function logic 415. In various examples, readout circuitry 411 may include amplification circuitry, analog-to-digital (ADC) conversion circuitry, or otherwise. Function logic 415 may simply store the image data or even manipulate the image data by applying post image effects (e.g., autofocus, crop, rotate, remove red eye, adjust brightness, adjust contrast, or otherwise). In one example, readout circuitry 411 may readout a row of image data at a time along readout column lines (illustrated) or may readout the image data using a variety of other techniques (not illustrated), such as a serial readout or a full parallel readout of all pixels simultaneously.

In one example, control circuitry 421 is coupled to pixel array 405 to control operation of the plurality of photodiodes in pixel array 405. For example, control circuitry 421 may generate a shutter signal for controlling image acquisition. In the depicted example, the shutter signal is a global shutter signal for simultaneously enabling all pixels within pixel array 405 to simultaneously capture their respective image data during a single acquisition window. In another example, image acquisition is synchronized with lighting effects such as a flash.

In one example, imaging system 400 may be included in a digital camera, cell phone, laptop computer, automobile or the like. Additionally, imaging system 400 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 400, extract image data from imaging system 400, or manipulate image data supplied by imaging system 400.

Figure 5:
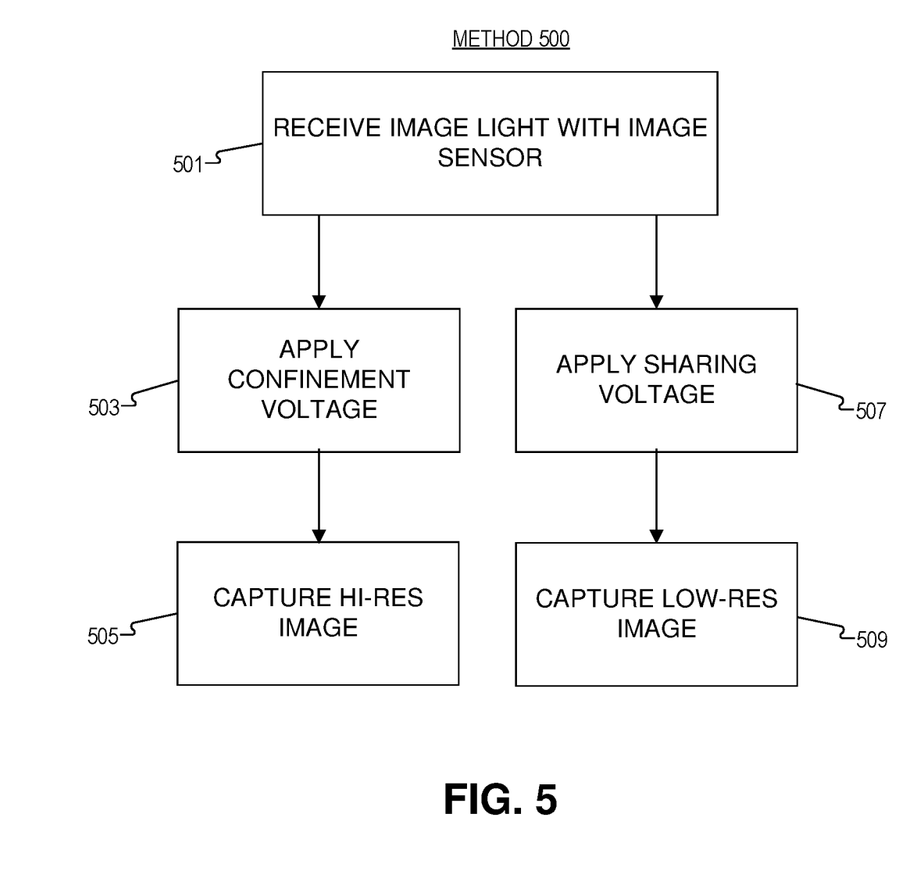
FIG. 5 illustrates a method of image capture, in accordance with the teachings of the present disclosure.

FIG. 5 illustrates a method 500 of image capture, in accordance with the teachings of the present disclosure. One of ordinary skill in the art having the benefit of the present disclosure will understand that blocks in method 500 may occur in any order and even in parallel. Further, blocks may be added to, or removed from, method 500, in accordance with the teachings of the present disclosure.

Block 501 shows receiving light with an image sensor. In the depicted example, the photodiodes in the image sensor convert the image light to image charge. The image charge is transferred out of the photodiodes to a floating diffusion with transfer transistors.

Block 503 illustrates applying a voltage to the gate terminals of the transfer transistors to substantially confine the image charge within the individual photodiodes. Thus, each photodiode generates its own image charge.

Block 505 depicts outputting a high resolution image from the image sensor. This high resolution image is output because all image sensor photodiodes were used to form the image.

Block 507 shows applying a voltage to the gate terminals of the transfer transistors to allow the image charge accumulated in the individual photodiodes to travel between the individual photodiodes. Thus groups of photodiodes generate shared image charge, and the individual photodiodes do not saturate with charge as easily.

Block 509 illustrates outputting a low resolution image from the image sensor. This is because blocks of pixels were used to form the image, so the effective number of photodiodes in the image sensor decreased. As stated above, these the low-res and high-res images may be used separately, or may be combined in a number of ways, in accordance with the teachings of the present disclosure.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a plurality of photodiodes disposed in a semiconductor material to convert image light into image charge;
   a floating diffusion disposed proximate to the plurality of photodiodes to receive the image charge from the plurality of photodiodes;
   a plurality of transfer transistors coupled to transfer the image charge from the plurality of photodiodes into the floating diffusion in response to a voltage applied to the gate terminal of the plurality of transfer transistors;
   a first trench isolation structure extending from a frontside of the semiconductor material into the semiconductor material, and surrounding the plurality of photodiodes; and
   a second trench isolation structure extending from a backside, opposite the frontside, of the semiconductor material into the semiconductor material, wherein the second trench isolation structure is disposed between individual photodiodes in the plurality of photodiodes, wherein the first trench isolation structure extends a first isolation structure depth into the semiconductor material, and the second trench isolation structure extends a second isolation structure depth, different from the first isolation structure depth, into the semiconductor material.

2. The image sensor of claim 1, wherein the plurality of photodiodes includes at least four individual photodiodes and at least four individual transfer transistors in the plurality of transfer transistors, and wherein the second trench isolation structure is substantially cross-shaped and extends between the individual photodiodes.

3. The image sensor of claim 2, wherein the image sensor is coupled to control circuitry to control operation of the plurality of photodiodes, and coupled to readout circuitry to readout image charge from the plurality of photodiodes, and wherein the control circuitry includes logic that when executed by the control circuitry causes the control circuitry to perform operations including:
   adjusting the voltage applied to the gate terminals to allow the image charge accumulated in the individual photodiodes to travel between the individual photodiodes; or
   adjusting the voltage applied to the gate terminals to substantially confine the image charge within the individual photodiodes.

4. The image sensor of claim 3, wherein the control circuitry further includes logic that when executed by the control circuitry causes the control circuitry to perform operations including:
   capturing an image with a first resolution when the voltage applied to the gate terminals allows the image charge accumulated in the individual photodiodes to travel between the individual photodiodes; or
   capturing an image with a second resolution when the voltage applied to the gate terminals substantially confines the image charge within the individual photodiodes, wherein the second resolution is greater than the first resolution.

5. The image sensor of claim 4, wherein the control circuitry and readout circuitry are disposed, at least in part, in an oxide layer proximate to the first semiconductor material.

6. The image sensor of claim 1, wherein the gate terminals vertically extend into the semiconductor material from the frontside of the semiconductor material.

7. The image sensor of claim 6, wherein the gate terminals surround, at least in part, the floating diffusion, and wherein the gate terminals extend into the semiconductor material a first depth and the floating diffusion extends into the semiconductor material a second depth, wherein the first depth is greater than the second depth.

8. The image sensor of claim 1, wherein the first trench isolation structure includes an oxide material surrounded by dopant in the semiconductor material.

9. The image sensor of claim 8, wherein the second trench isolation structure includes the oxide material surrounded by the dopant in the semiconductor material.

10. The image sensor of claim 9, wherein the first trench isolation structure extends into the semiconductor material a first depth, and wherein the second trench isolation structure extends into the semiconductor material a second depth, wherein the second depth is greater than the first depth.

11. A method of image sensor fabrication, comprising:
    providing a semiconductor material;
    forming a second trench isolation structure in the semiconductor material extending from a backside, opposite a frontside, of the semiconductor material into the semiconductor material;
    forming a plurality of photodiodes in the semiconductor material, wherein the second trench isolation structure is disposed at least in part between individual photodiodes in the plurality of photodiodes;
    forming a first trench isolation structure in the semiconductor material extending from the frontside of the semiconductor material into the semiconductor material, wherein the first trench isolation structure surrounds the plurality of photodiodes, wherein the first trench isolation structure extends a first isolation structure depth into the semiconductor material, and the second trench isolation structure extends a second isolation structure depth, different from the first isolation structure depth, into the semiconductor material; and implanting a floating diffusion in the semiconductor material, wherein the floating diffusion is positioned in the semiconductor material to receive image charge from the plurality of photodiodes.

12. The method of claim 11, further comprising forming a plurality transfer transistors extending into in the semiconductor material and coupled to transfer charge from the plurality of photodiodes to the floating diffusion, including:
   etching a trench in the semiconductor material;
   forming a dielectric material in the trench; and
   depositing a conductive material in the trench to form a gate terminal, wherein the dielectric material is disposed between the semiconductor material and the gate terminal.

13. The method of claim 12, wherein at least a portion of the conductive material is disposed proximate to the frontside of the semiconductor material, and the frontside surface of the semiconductor material is disposed at least in part between the conductive material and the semiconductor material.

14. The method of claim 11, wherein forming the first trench isolation structure includes:
   etching a first trench in the semiconductor material;
   doping the semiconductor material surrounding the first trench; and
   depositing a first core structure including an oxide material in the trench.

15. The method of claim 14, wherein forming the second trench isolation structure includes:
   etching a second trench in the semiconductor material;
   doping the semiconductor material surrounding the second trench; and
   depositing a second core structure including the oxide material in the trench.

16. The method of claim 15, wherein the first trench is etched a first depth into the semiconductor material, and wherein the second trench is etched a second depth into the semiconductor material, wherein the second depth is greater than the first depth.

17. The method of claim 16, wherein the second trench includes a substantially cross-shaped portion to separate the individual photodiodes.

18. The method of claim 11, wherein forming the floating diffusion and the photodiodes includes implanting dopant atoms using ion implantation.

19. The method of claim 18, further comprising attaching a bonding wafer to the backside of the semiconductor material after implanting the dopant atoms and forming the second trench isolation structure.

20. The method of claim 19, further comprising forming an interconnect layer, including electrical interconnects, proximate to the frontside of the semiconductor material.

* * * * *